United States Patent [19]

Takatori et al.

[11] Patent Number: 5,408,142
[45] Date of Patent: Apr. 18, 1995

[54] HOLD CIRCUIT

[75] Inventors: Sunao Takatori; Makoto Yamamoto, both of Tokyo, Japan

[73] Assignee: Yozan Inc., Tokyo, Japan

[21] Appl. No.: 156,766

[22] Filed: Nov. 24, 1993

[30] Foreign Application Priority Data

Nov. 25, 1992 [JP] Japan .................................. 4-339722

[51] Int. Cl.6 ...................... G11C 27/02; H03K 5/159
[52] U.S. Cl. ......................................... 327/91; 327/94
[58] Field of Search ............... 307/520, 521, 352, 353; 328/151, 167

[56] References Cited

U.S. PATENT DOCUMENTS

| | | | |
|---|---|---|---|
| 3,158,759 | 11/1964 | Jasper | 307/353 |
| 3,671,782 | 6/1972 | Wittlinger et al. | 307/353 |
| 4,546,270 | 10/1985 | Cabot | 307/353 |
| 4,591,736 | 5/1986 | Hirao et al. | 307/353 |
| 4,717,883 | 1/1988 | Browning | 307/353 |
| 4,845,382 | 7/1989 | Eouzan et al. | 307/353 |

FOREIGN PATENT DOCUMENTS

| | | | |
|---|---|---|---|
| 0240682 | 10/1987 | European Pat. Off. | 307/353 |
| 3721059 | 1/1989 | Germany | 307/353 |
| 0135775 | 6/1987 | Japan | 307/352 |
| 0311700 | 12/1988 | Japan | 307/353 |

OTHER PUBLICATIONS

Erdi et al., "A Precision FET-Less Sample and Hold with High Charge-to-Droop Current Ratio," IEEE Journal, vol. SC-13, No. 6, Dec. 1978, pp. 864-873.

Massara, "Synthesis of Low-Pass Forms", The Electrical Engineering Handbook, pp. 674-691.

Primary Examiner—Timothy P. Callahan
Assistant Examiner—Toan Tran
Attorney, Agent, or Firm—Cushman, Darby & Cushman

[57] ABSTRACT

A hold circuit has a purpose to provide a hold circuit capable of controlling a hold error of an analog hold in the minimum during transferring. A hold circuit keeps a voltage signal, whose voltage level is compensated by operational amplifiers $Amp_1$ and $Amp_2$, at capacitances $C_1$ and $C_2$ by two steps, and holding and transferring of voltage data is performed at the different timing. The accuracy is compensated, as well.

1 Claim, 4 Drawing Sheets

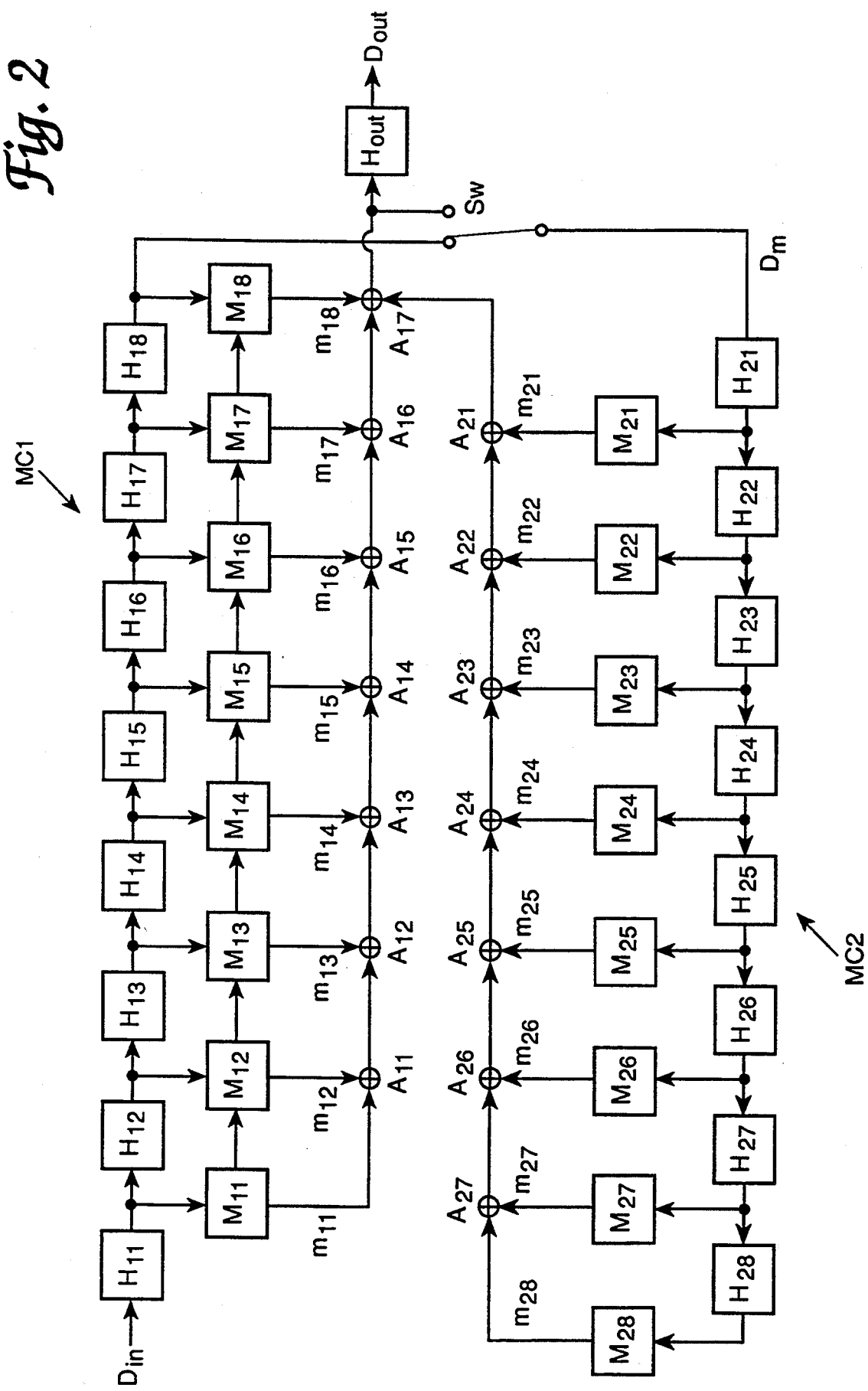

HOLD CIRCUIT

FIELD OF THE INVENTION

The present invention relates to a hold circuit to keep a plural number of successive input data in time series.

BACKGROUND OF THE INVENTION

For example, in a digital filter, a hold circuit keeps an input data in time series and the data is multiplied by a multiplier and integration is performed. Data once kept is successively transferred to the following hold circuit and input into another multiplier.

Conventionally, in a digital filter, hold and transferred data are digital data, and a little level down can be omitted. On the other hand, in computers whose main body is an analog operation, it is necessary to treat an analog data, and hold error can not omitted. However, any hold circuit considering about transferring of hold of an analog data is not known.

SUMMARY OF THE INVENTION

The present invention is invented so as to solve the above problems and has a purpose to provide a hold circuit capable of decreasing a hold error of an analog hold during transferring.

A hold circuit according to the present invention keeps a voltage signal, whose voltage level is compensated by a operational amplifier, at a capacitance by two steps, and a holding and transferring of voltage data is performed at the different timing. The accuracy is compensated, as well.

BRIEF DESCRIPTION OF THE DRAWINGS

FIG. 2 is a block showing a filter circuit using the same embodiment as FIG. 1.

PREFERRED EMBODIMENT OF THE PRESENT INVENTION

Hereinafter an embodiment of a hold circuit according to the present invention is described with referring to the attached drawings.

Figure 1:
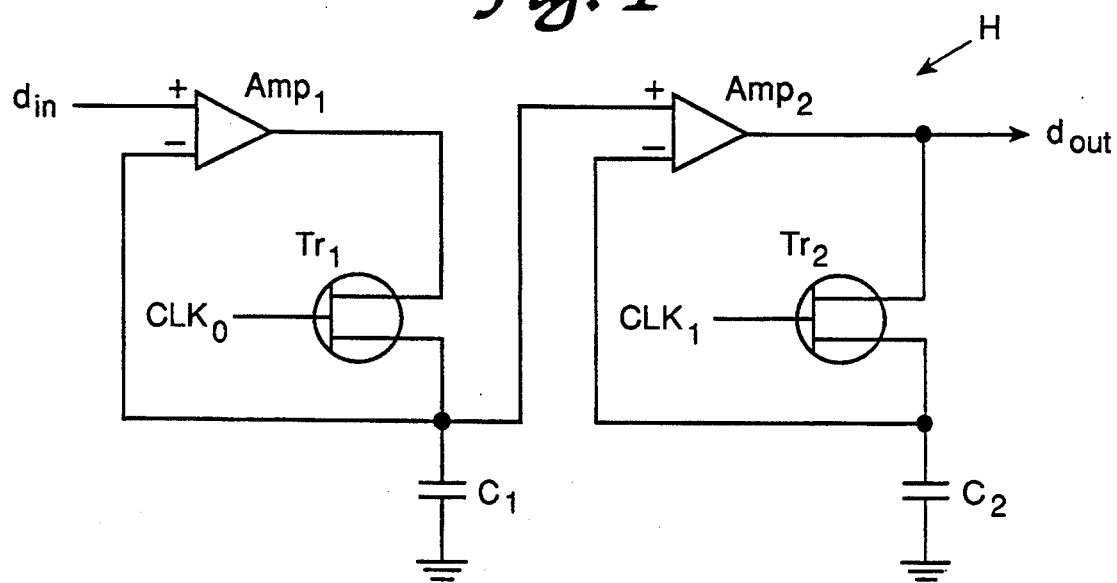
FIG. 1 is a circuit showing an embodiment of a hold circuit relating to the present invention.

A hold circuit H in FIG. 1 has a pair of operational amplifiers $Amp_1$ and $Amp_2$ and a pair of field-effect transistors $Tr_1$ and $Tr_2$. An input data $d_{in}$ is input to a non-inverted input of $Amp_1$. An output of $Amp_1$ is connected with a drain of $Tr_1$. A source of $Tr_1$ is earthed through a capacitance $C_1$ and fed back to an inverted inputs of $Amp_1$. A clock $CLK_0$ is input to a gate and $Tr_1$ is conductive when $CLK_0$ is high level. At the time that $Tr_1$ is conductive, an output of $Amp_1$ is controlled in order that a voltage equal to $d_{in}$ impresses to $C_1$, and $C_1$ stores electric charges in order that a charged voltage becomes $d_{in}$.

A charged voltage of $C_1$ is connected with a non-inverted input of $Amp_2$. An output of $Amp_2$ is connected with a drain of $Tr_2$ and a source of $Tr_2$ is earthed through a capacitance $C_2$ and fed back to an inverted input of $Amp_2$. In $Tr_2$, a clock $CLK_1$ of an inverted phase of $CLK_0$ is input to a gate, and $Tr_2$ is conductive in an opposite positioned phase of $Tr_1$. When $Tr_2$ is conductive, an output of $Amp_2$ is controlled in order that a voltage equal to $d_{in}$ is impressed to a charged voltage of $C_1$. $C_2$ stores an electric charge in order that a charged voltage is equal to $d_{in}$. And $d_{out}$ corresponding $d_{in}$ is output. As a result, $d_{in}$ by a 1 clock timing is kept and holding is surely performed by the predetermined timing because there is no influence in the following stage during charging of $C_1$.

A feed back system using operational amplifiers $Amp_1$ and $Amp_2$ compensates accuracy of outputs, so that a hold error can be controlled in the minimum.

A hold circuit is used for a filter circuit shown in FIG. 2. Hold circuits are shown by from $H_{11}$ to $H_{18}$ and from $H_{21}$ to $H_{28}$ in FIG. 2.

In FIG. 2, a hold circuit has the first summing products circuit MC1 and the second summing products circuit MC2. The first summing products circuit MC1 is composed of a plural number of serially connected hold circuits from $H_{11}$ to $H_{18}$ and an output of each hold circuit $H_{1k}$ is input to a multiplication circuit $M_{1k}$. On the other hand, the second summing products circuit MC2 is composed of a plural number of serially connected hold circuits from $H_{21}$ to $H_{28}$ and an output of each hold circuit $H_{2k}$ is input to a multiplication circuit $M_{2k}$.

An input data $D_{in}$ is input to the first summing products circuit and it is transferred to the next hold circuit after it is once kept in each hold circuit. Then, data in time series of $D_{in}$ is kept in each hold circuit. This time series data is shown by $X(t-k)$. Beforehand, the predetermined multipliers from a1 to a8 are input to each multiplication circuit from M11 to M18, and a following multiplication for the time series data is executed.

*mrcuit. This time series data is shown by $X(t-k)$. Beforehand, the predetermined multipliers from a1 to a8 are input to each multiplication circuit from M11 to M18, and a following multiplication for the time series data is executed.*

$$m_{1k} = a_k \times X(t-k)$$

$m_{1k}$ is a result of multiplication of a multiplying circuit $M_{1k}$.

Outputs of a multiplication circuit $M_{1k}$ and $M_{1(k+1)}$ are added by an adding circuit $A_{1k}$, and an adding result is output to the next adding circuit $A_{1(k+1)}$. Therefore, an adding circuit $A_{17}$ calculates a total of outputs of all multiplying circuits in the first summing products circuit. A following formula shows the total.

$$\sum_{i=1}^{8} a_k \times X(t-k)$$

To the second summing products circuit, an output $A_{17}$ or an output $H_{18}$ are input as an input data $D_m$ through a switch SW, and it is transferred to the next hold circuit after $D_m$ is once kept in each hold circuit from $H_{21}$ to $H_{28}$. Then, data of time series of $D_m$ is kept in each hold circuit. This sequential data is shown by $Y(t-k)$. Predetermined multipliers from $b_1$ to $b_8$ are input in each multiplying circuit from $M_{21}$ to $M_{28}$, and the following multiplication for the time series data is executed.

$$m_{2k} = b_k \times Y(t-k)$$

$m_{2k}$ is a multiplied result of a multiplying circuit $M_{2k}$.

Outputs of multiplication circuits $M_{k2}$ and $M_{2(k+1)}$ are added by an adding circuit $A_{2k}$, and the adding result is output to the next adding circuit $A_{2(k-1)}$. Therefore, an adding circuit $A_{27}$ is a total of outputs of all multiplying circuits in the second summing products circuit. Then the total is shown by the following formula 2.

$$\sum_{i=1}^{8} b_k \times Y(t-k)$$

And, an output of an adding circuit $A_{21}$ is input to an adding circuit $A_{17}$ in the first sunning products MC1 and an output of $A_{17}$ is a total of multiplied result of both MC1 and MC2.

When SW is connected with a side of $H_{18}$, Dm is $X(t-8)$, then an output of MC2 is shown by formula 3.

$$\sum_{i=1}^{8} b_k \times X(t-k-8)$$

Here, expressing $b_k = a_{(k+8)}$. a total of MC1 and MC2 output from $A_{17}$ is formula 4.

$$\sum_{i=1}^{16} a_k \times X(t-k)$$

Then a characteristics of FIR type filter is obtained.

When SW is connected with a side of $A_{17}$, then formula 5 is shown.

$$D_m = \sum_{i=1}^{8} a_k \times X(t-k) + \sum_{i=1}^{8} b_k \times Y(t-k)$$

Generally expressing $Y(t) = D_m$, and a characteristics of IIR type is obtained.

As mentioned above, switching only SW on a special circuit, SW realizes a filter of two types filters of FIR and IIR are realized and a filter with a comparative large stages using all hold circuits and multiplication circuits are realized in FIR type. That is, high speed filter with wide usage can be realized.

Figure 3:
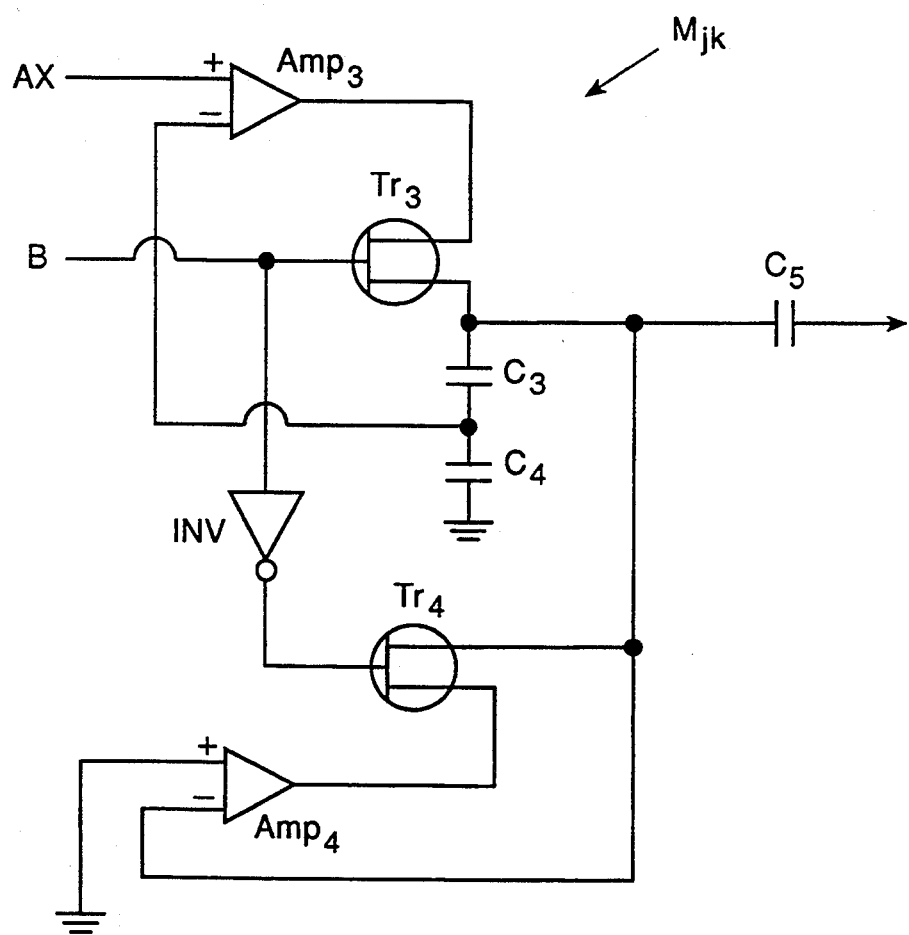
FIG. 3 is a circuit showing a multiplication circuit in a filter circuit.

FIG. 3 shows an embodiment of a multiplication circuit $M_{jk}$, $M_{jk}$, has a pair of operational amplifiers Amp3 and Amp4, and a pair of field-effects transistors Tr3 and Tr4. An input analog data AX is input to a non-inverted input of Amp3. An output of Amp3 is connected with a drain of Tr3, and a source of Tr3 is earthed through capacitances $C_3$ and $C_4$. A voltage between $C_3$ and $C_4$ is fed back to an inverted input of Amp3. Tr3 is conductive when a digital input B is input to a gate and is high level. When Tr3 is conductive controlling an output of Amp3 in order that a voltage equal to AX impresses to $C_4$, and electric change is stored in order that a charged voltage is Ax in $C_4$. This time, a source voltage of Tr3 is $Ax\{(C_3-C_4)/C_3\}$.

In Amp4, a non-inverted input is earthed, and its output is connected with a source of Tr4. A drain of Tr4 is earthed to $C_3$ and fed back to an inverted input of Amp4. A digital data inverting B by an inverter INV is input to a gate of Tr4, and Tr4 is conductive when B is low level. When Tr4 is conductive, an output of Amp4 is controlled to be 0V at a drain of Tr4.

A source of Tr3 and a drain of Tr4 are connected with a capacitance $C_5$ for outputting, and a voltage value multiplied a weight decided by a capacitive coupling with $C_5$ is an output. That is, $M_{jk}$ performs $\{(C_3-C_4)/C_3\} \cdot C_{cp}$.

$c_{cp}$ is a weight decided by capacitive coupling. Multiplication by multiplier 0 is executed.

Figure 4:
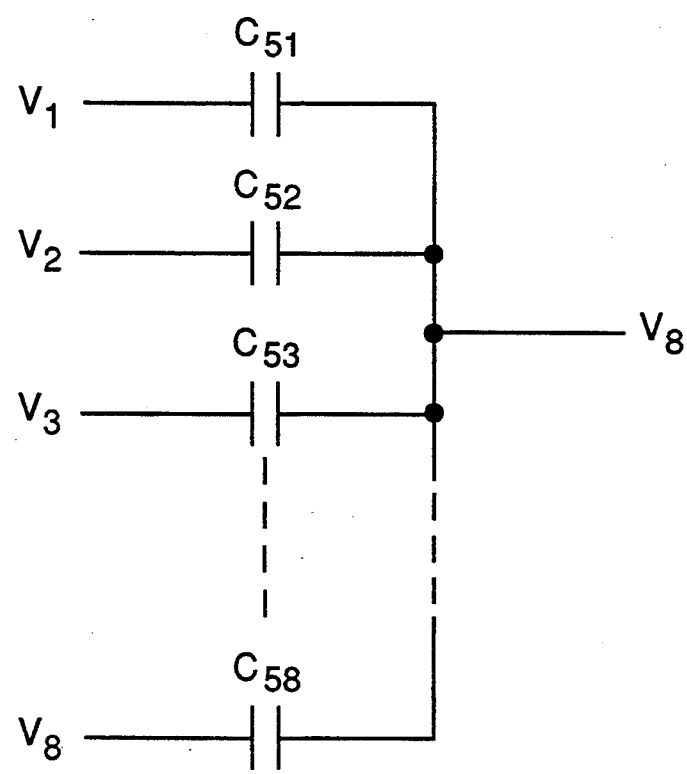
FIG. 4 is a circuit showing an example of a capacitive coupling.

A capacitive coupling is a circuit as shown in FIG. 4, and consists of a plural number of capacitances parallelly connected (here 8 capacitances from $C_{51}$ to $C_{58}$). When voltages from $V_1$ to $V_8$ are impressed to these capacitances, an output voltage $V_8$ is shown by a following formula and a weighted addition is executed.

Providing circuits as FIG. 3 parallelly, inputting each bit of a digital data as B to the circuit, and setting $\{(C_3-C_4)/C_3\}$ Ccp in $2^n$, a multiplication of an analog data AX and a digital data is directly executed.

The above adding circuit $A_{jk}$ can be realized by the circuit of FIG. 4 with 2 or 3 inputs.

An output signal $D_{out}$ output by above composition is kept once in $H_{out}$.

Figure 6:
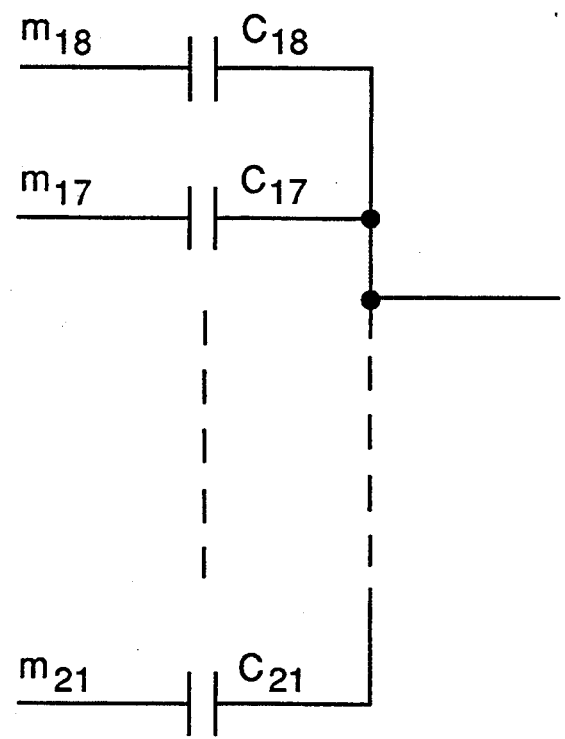
FIG. 6 is a circuit diagram showing an adding circuit in the second embodiment of a filter circuit.
Figure 5:
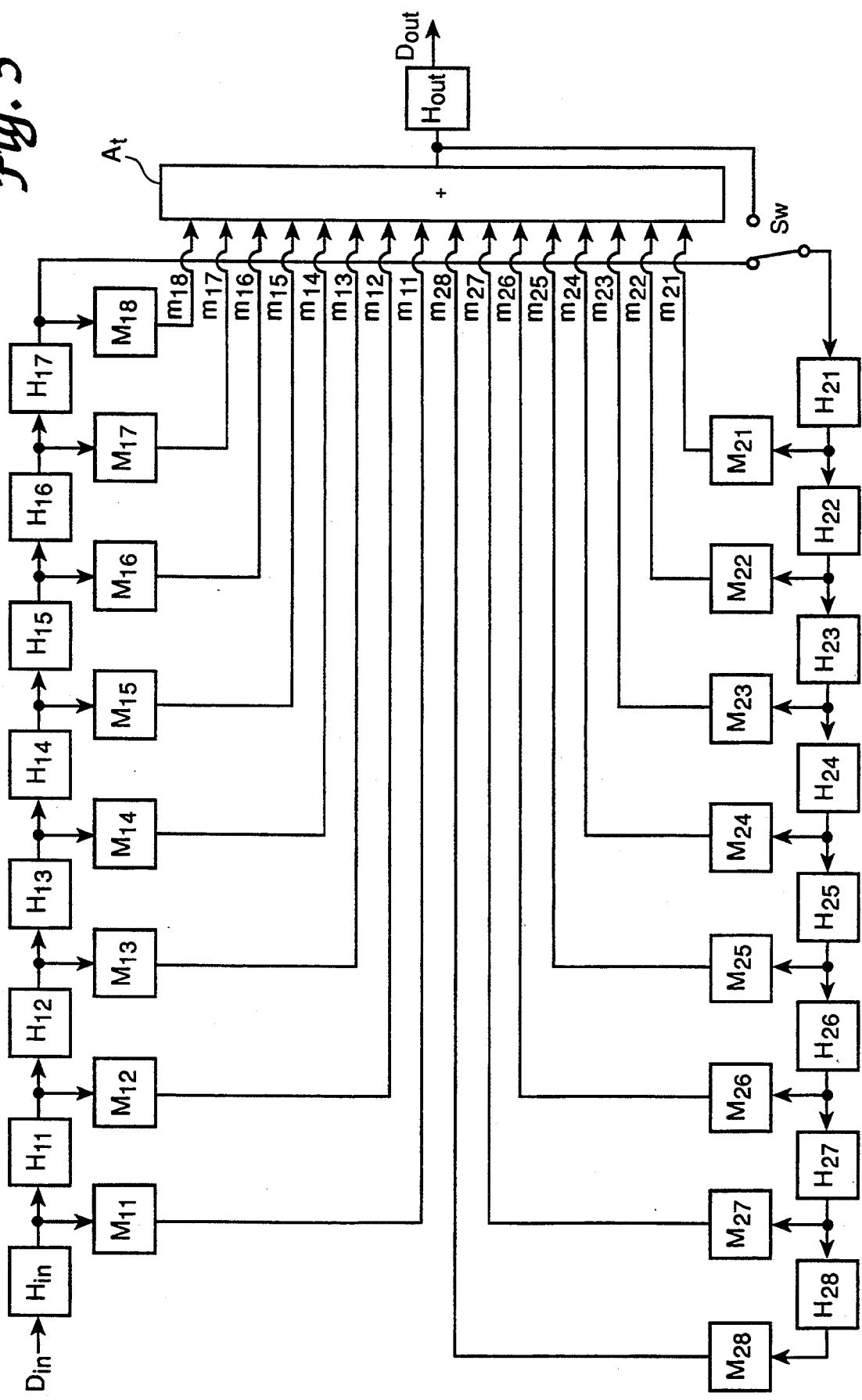
FIG. 5 is a block diagram showing the second embodiment of a filter circuit.

FIG. 5 shows the second embodiment of a filter circuit. Instead of an adding circuit $A_{jk}$, one adding circuit At is used. If an output of each multiplying circuit $M_{jk}$ is $m_{jk}$, then a weighted addition is executed by a capacitive coupling of capacitance $C_{jk}$ parallelly connecting, as shown FIG. 6. The manners of calculation is same as that of circuit in FIG. 4.

As mentioned above, a hold circuit relating to the present invention keeps a voltage signal, whose voltage level is compensated by a operational amplifier, at a capacitance by two steps, and holding and transferring of voltage data is performed at the different timing. The accuracy is compensated, as well so that a hold circuit capable of controlling a hold error of an analog hold in the minimum during transferring.

What is claimed is:

1. A hold circuit comprising:
   i) a first operational amplifier connected with an input data at a non-inverted input;
   ii) a second operational amplifier;
   iii) a first field-effect transistor connected with an output of said first operational amplifier at a drain;
   iv) a first capacitance connected at a first terminal with a source of said first field-effect transistor, with an inverted input of said first operational amplifier, and with a non-inverted input of said second operational amplifier, and connected at a second terminal with the earth;
   v) a second field-effect transistor connected with an output of said second operational amplifier at a drain; and
   vi) a second capacitance connected at a first terminal with a source of said second field-effect transistor and an inverted input of said second operational amplifier and connected at a second terminal with the earth.

* * * * *